United States Patent [19]
Gilmour et al.

[11] Patent Number: 5,723,898
[45] Date of Patent: Mar. 3, 1998

[54] ARRAY PROTECTION DEVICES AND METHOD

[75] Inventors: Richard Alfred Gilmour, Colchester; Thomas John Hartswick, Underhill; David Charles Thomas, Richmond; Ronald Robert Uttecht, Essex Junction; Erick Gregory Walton, South Burlington, all of Vt.

[73] Assignee: International Business Machines Corp., Armonk, N.Y.

[21] Appl. No.: 726,543

[22] Filed: Oct. 4, 1996

Related U.S. Application Data

[60] Continuation of Ser. No. 389,533, Apr. 13, 1995, abandoned, which is a division of Ser. No. 221,715, Mar. 31, 1994, Pat. No. 5,420,455.

[51] Int. Cl.$^6$ .................................................. H01L 27/02
[52] U.S. Cl. ........................ 257/529; 257/209; 257/665; 257/758
[58] Field of Search ................................ 257/758, 529, 257/530, 209, 665, 50; 365/96, 225.7

[56] References Cited

FOREIGN PATENT DOCUMENTS 3-169073   7/1991   Japan ..................................... 257/758

Primary Examiner—Jerome Jackson, Jr.
Assistant Examiner—John Guay
Attorney, Agent, or Firm—Thornton & Thornton; Howard J. Walter

[57] ABSTRACT

The present disclosure sets forth an improved integrated circuit in which circuit elements, adjacent to a fuse, are protected by barriers positioned adjacent the fuse. In the improved integrated circuit the barriers are non-frangible, high melting point structures buried in the passivating layer, covering a wiring layer containing a fuse, and are between the fuse and adjacent circuit elements in the wiring layer structures. Also taught is a method of protecting circuit elements adjacent a fuse comprising the steps of depositing an insulating layer on the surface of a semiconductor device having active regions therein, forming a plurality of fuses and circuit elements in said layer, coating said fuses and elements with a second insulating layer, patterning said second insulating layer to form grooves between each of said fuses and any adjacent fuse or circuit element, and depositing a high melting point and non-frangible material in said grooves.

2 Claims, 3 Drawing Sheets

ARRAY PROTECTION DEVICES AND METHOD

This application is a continuation of application Ser. No. 08/389,533 filed Apr. 13, 1995, now abandoned, which was a divisional of application Ser. No. 08/221,715 filed Mar. 31, 1994 now U.S. Pat. No. 5,420,455.

FIELD OF THE INVENTION

This invention relates to semiconductor integrated circuits which can be tailored by cutting lines in the circuit and, more particularly, to such circuits which have built therein barriers devices adjacent each line to be cut. These barriers prevent accidental injury to nearby circuit elements when the circuit is tailored. The invention further relates to the method of making the improved circuit.

BACKGROUND OF THE INVENTION

Semiconductor integrated circuits are formed in a body of semiconductor material having active regions therein which are joined in a desired circuit configuration by a plurality of wiring layers laid down on the surface of the body.

Many semiconductor integrated circuits, such as logic circuits, are designed to be tailored, after manufacture, to provide certain logical combinations or meet other selected criteria. To permit such tailoring such circuits are designed with circuit alteration devices, typically and hereinafter referred to as fuses, which are usually in the form of lines that can be physically broken or cut to thereby alter the circuit from its original configuration. This tailoring ability is provided in such circuits, during the circuit design and is included as part of the wiring layers of the circuit.

In the manufacture of the circuit, these wiring layers are deposited and defined and interconnected with conductive vias through a series of well known photolithography and metal etching steps. Each such wiring level is coated with a layer of a glassy protective material, known as a passivation layer, which protects and insulates the wiring of each layer. The creation of integrated circuits with such multiple wiring layers is well known to the semiconductor art.

In such circuits it has been found that if the lines or fuses are formed with positive side slopes, they offer distinct advantages over line with negatively sloped side wall. The advantages are especially realized during the fabrication of the wiring levels, the subsequent deposition of the passivation layer, and the formation of the interconnection vias.

In some circuits, such as CMOS logic circuits, the fuses, designed in the circuit are usually formed in regular arrays in the upper most layers of wiring and in a position such that other wiring is not placed immediately thereover. In such arrays the fuses are often aligned in parallel rows and placed as closely together as is possible. By opening selected ones of these fuses the logic elements of the circuits can be arranged in different combinations to perform different logic functions.

These fuses are typically opened by applying a laser pulse of sufficient size, duration and power as to superheat and vaporize the metal forming the fuse. This superheating of the fuse and its vaporization fractures and blows away a portion of the overlying glassy protective layer creating a saucer shaped crater in the protective layer. When the protective layer ruptures, cracks can radiate outwardly causing additional damage such as breakage of or the uncovering of adjacent elements. Such uncovering of the adjacent elements can cause subsequent corrosion and premature failure of the circuit. Furthermore, there is no known means of repairing any of the adjacent circuit elements accidentally altered by the blowing of an adjacent fuse.

It has been found that when the fuse, being blown, has sides with a positive slope these effects are worsened because the beam, used to vaporize the fuse, is reflected therefrom and can cause partial melting and reflowing of adjacent circuit elements altering their resistive and capacitive characteristics and hence the circuit to which they are connected.

To prevent such damage to the adjacent elements, the prior art could provide no solution except that of increasing the inter-element distance between the fuse, and the adjacent elements. This solution is undesirable. The entire direction in the integrated circuit art has been directed towards reducing the size of the circuit and hence reducing inter-element dimensions to the smallest level possible. Thus, the only available solution was unacceptable but, until the present invention, these has been no other.

Accordingly, there now exists a need for an improved circuit arrangement which avoids all the above described problems associated with the blowing of such fuses as found in the prior art. The present invention, achieves these desirable results, by preventing both the beam energy and the effects of the fuse blowing to reach or affect any adjacent element in the circuit while maintaining the presently achievable, minimum, inter-element dimensions and all the other known advantages of such fuse arrays.

SUMMARY OF THE INVENTION

An object of the present invention is to provide an improved integrated circuit in which circuit elements adjacent to the fuse are unaffected when the fuse blows open.

It is another object of the present invention to prevent either the energy, of the fuse blowing operation, or the effects of the fuse blowing to reach or affect any adjacent element in the circuit while still providing minimum inter-element dimensions and all the other known advantages of such fused circuits.

It is another object of the invention to provide all the above and other objects and advantages, of the present invention, in an integrated circuit while using conventional integrated circuit materials and techniques.

These desirable results and other objects and advantages, of the present invention, are realized and provided by, depositing between each circuit element to be protected and the fuse being blown a body formed of a high melting point, non-frangible material. In the present invention, there is thus provided a semiconductor integrated circuit, having a plurality of metallic structures on a surface thereof with one of the structures being a fuse and a body of non-frangible, high melting point material positioned between the fuse and adjacent circuit elements.

These and other features are provided by the present invention which relates to a method of protecting adjacent circuit elements comprising the steps of depositing an insulating layer on the surface of a semiconductor device having active regions therein, forming a plurality of fuses and conductors on said layer, coating said fuses and conductors with a second insulating layer, patterning said layer with grooves between said fuses and any adjacent fuse or conductor and depositing a high melting point and non-frangible material in said grooves.

These and other objects, features, and advantages of the invention will be apparent from the following more particu-

DESCRIPTION OF THE PREFERRED EMBODIMENT

Figure 1:
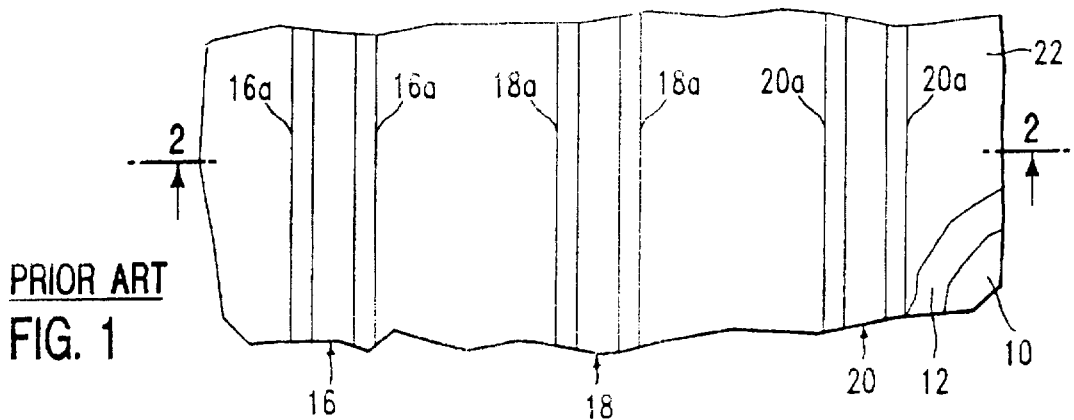
FIG. 1 shows a top view of a typical fuse array as used in an integrated logic circuit.

Basically, the present invention, as will be more fully set forth below, describes an integrated circuit having a multiplicity of fuses and conductive lines on its surface.

Referring now to the drawings and especially FIGS. 1 to 4 there will be generally described a method of producing an integrated circuit with a fuse array therein. In these FIGS. 1–4 a semiconductor substrate 10 has created therein a plurality of active device regions (not shown) therein. The substrate 10 typically is formed of silicon but may be any suitable semiconductor material. The active device regions are formed by processes well known to the semiconductor art.

Once all the active regions are formed in the substrate an insulating layer 12, about 10,000 Å in thickness, is formed over the surface 14 of the substrate 10. This layer 12 is typically formed by a chemical vapor deposit (CVD) of silicon oxide ($SiO_2$). A photoresist (not shown) is laid down on top of the layer 12 and patterned to etch, by reactive ion etching, a plurality of via holes (not shown) in layer 12 to expose selected portions of the active regions. The photoresist is then removed and metal via connectors (not shown) are deposited therein to provide connectors from the active regions to the surface of layer 12. Once these connectors are formed a tri-level metal layer, typically about 10,000 Å in thickness, is deposited over the layer 12 and defined into a predetermined metallization or wiring pattern illustrated by metal lines 16, 18, and 20 by a suitable plasma etching process. Desirably, these lines are approximately 1.4 microns in width, at their widest point and are positioned 7.2 microns on center. Preferably this tri-level metal layer consists of outer layers 24 and 26 of titanium and a copper-aluminum core 28.

Figure 2:
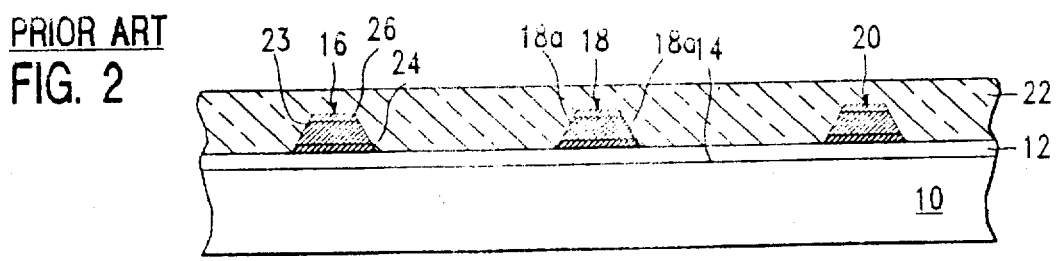
FIG. 2 shows a section of the array of FIG. 1 taken along the lines 2—2.

These lines can, in actuality, be fuses, resistors, capacitor plates, or merely conductive lines interconnecting various portions of the integrated circuit being built. In the present embodiment it will be assumed that these lines 16, 18, and 20 are designed as fuses in a logic array. The fuses 16, 18, and 20 are usually created by coating the deposited metal with a new photoresist layer, patterning the layer and then exposing the metal layer to a suitable reactive ion etch. As shown in FIG. 2 this reactive ion etch causes the fuses 16, 18, and 20 to have positive side slopes 16a, 18a, and 20a.

Once the lines 16, 18, and 20 are defined, the photoresist is removed and the entire substrate is coated with a passivation layer 22, typically formed of $SiO_2$, and ranging in thickness between 7500 Å and 20,000 Å. The surface of this layer 22 is now planarized by known techniques. This layer 22 encloses and protects the defined wiring pattern. If additional levels of wiring are required the above described processes can be followed to define the additional wiring levels as will be later described in conjunction with FIGS. 9 and 10. All of the above described techniques are widely known and used in the semiconductor art and further description is not believed necessary.

Logic arrays are typically fabricated in a universal logic circuit and then altered by selective cutting of lines, i.e., blowing the fuses, therein to form the final desired logic. Presently such selective cutting of the lines is by a laser beam.

In the present example it will be assumed that to achieve the desired configuration it is necessary that the central line 18 or fuse is to cut. The process employed directs a laser beam, of sufficient energy and duration, against the line 18. For the above described lines, a laser, such as is sold by the ESI company having a beam energy of 2 microjoules, a diameter of between 6 and 7 microns and a pulse width of about 9 nanoseconds is directed against the line for about 9 nanoseconds.

Figure 3:
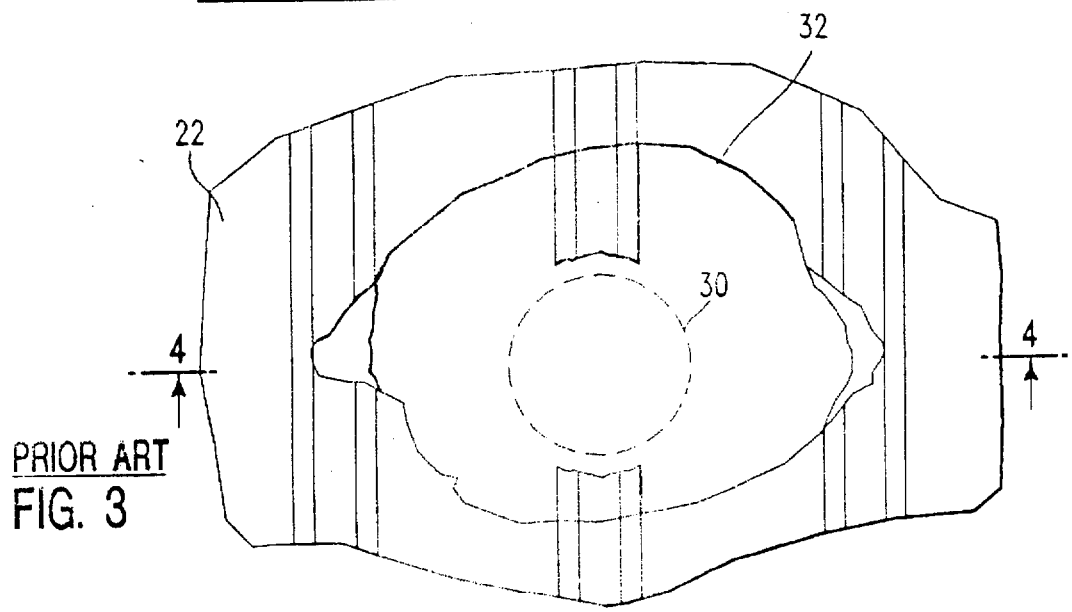
FIG. 3 shows the array of FIG. 1 after one of the fuses therein has been blown by application of a laser beam.
Figure 4:
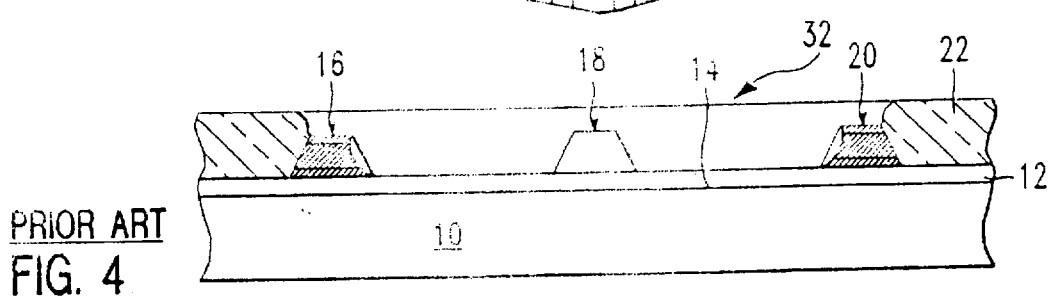
FIG. 4 shows a section of the array of FIG. 3 taken along the lines 4—4.

In FIG. 3, the beam, being applied, is indicated by the dotted circle 30. The beam energy is absorbed by the line 18 causing the area of the line under the beam to be super heated and vaporized. When the area under beam vaporizes, the line is severed i.e., the fuse is blown. Because of the rapidity of the vaporization of the line 18 under the beam a large section of the overlying passivation layer 22 is blown away leaving a large, substantially circular crater 32 centered around the position where the beam impinged on the line 18. It should be noted that the crater created by the removal of the overlying passivation layer extends over the adjacent lines 16 and 20 exposes them. When these lines are so exposed they become subject to corrosion which can result in subsequent failure of these lines and premature failure of the circuit. It has further been found that some of the beam energy is reflected of the positive sloped sides of the line 18 and this energy is directed towards the adjacent lines 16 and 20 and causes melting or erosion of a portion of these lines 16 and 20 exerting additional pressure and stress on the adjacent lines 16 and 20. If the lines are sufficiently close, the amount of melting can be sufficient to cut through the lines. Even if the melting of the lines is insufficient to sever the lines 16 and 20 it can still be severe enough to cause a change in the resistivity of the line thus creating undesirable circuit changes. Finally, in some cases, extensive cracks have been found to radiate, through the passivation layer, out from the crater causing one or more of the adjacent lines to be broken. This inadvertent breaking of a line, that was not selected to be broken, leads to significant production losses.

To avoid these problems the prior art could only increase the center to center spacing of the lines to an extent that such effect did not occur. This prior art solution does not permit optimum circuit layout.

The present invention as shown in FIGS. 5 to 8 avoids all the problems encountered in the prior art while maintaining the smallest presently achievable, center to center, inter-line spacing.

Figure 5:
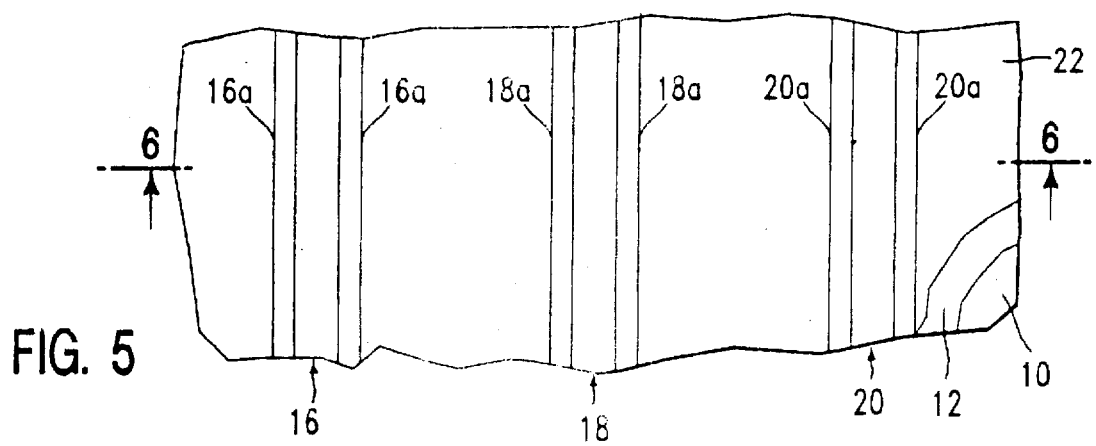
FIG. 5 has a top view of a fuse array similar to that of FIG. 1 with the present invention included therein.
Figure 6:
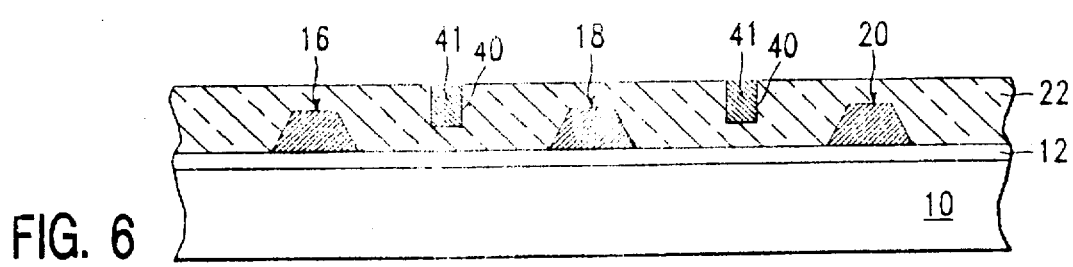
FIG. 6 shows a section of the array of FIG. 5 taken along the lines 6—6.
Figure 7:
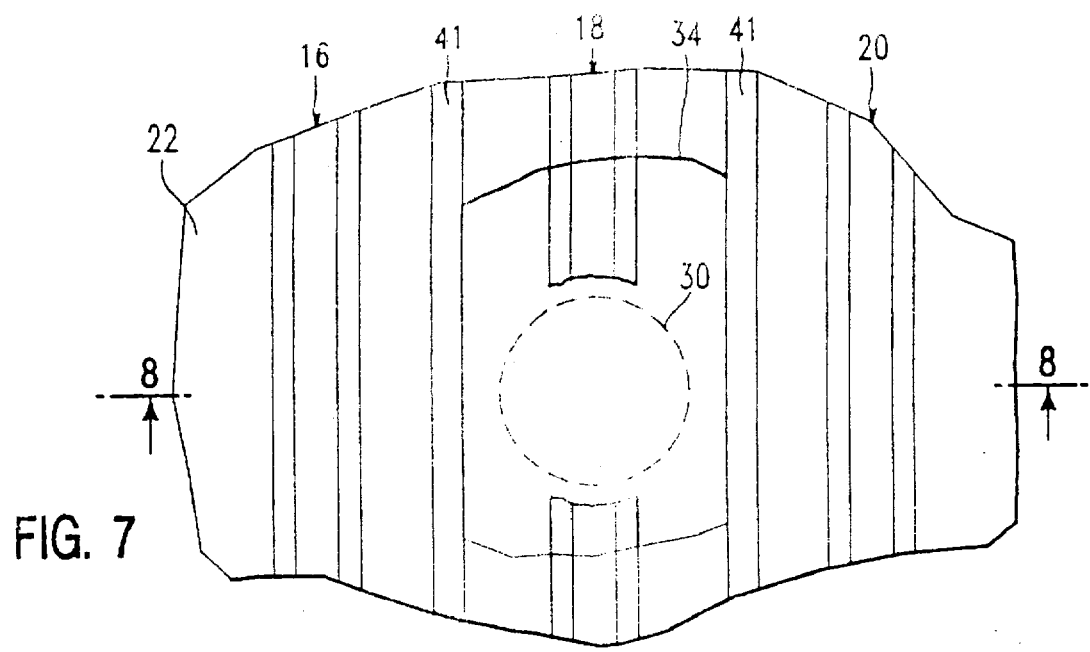
FIG. 7 shows the array of FIG. 5 after one of the fuses therein has been blown by application of a laser beam.
Figure 8:
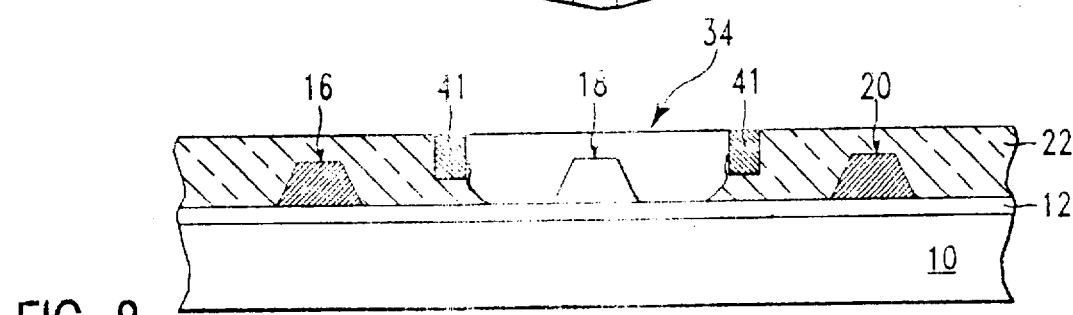
FIG. 8 shows a section of the array of FIG. 7 taken along the lines 8—8.

FIG. 5 is created using the steps described above to create the device shown in FIG. 1 and like numerals refer to like features. However, the device shown in FIG. 5 is further treated following the planarization of the passivating layer 22 by again masking the surface of layer 22 with photoresist, and patterning it so the layer 22 can be provided with a plurality of grooves 40 approximately 0.9 microns in width and of sufficient depth to extend at least halfway down the thickness of the metal lines 16, 18, and 20. Reactants such as a halogen or halogen based compounds may be used, with materials such as Fluroine, or Carbon Tetrafluoride ($CF_4$) or Carbon Trifluoride ($CHF_3$) being especially preferred for etching $SiO_2$. Photoresist is unaffected by these RIE etchants thus it not only protects the underlying passivation layer 22, except where the layer is exposed by patterning of the photoresist, but also defines the width of the grooves 40. As a result of the anisotropic nature of this RIE process, the sidewalls of the grooves 40 are sharply defined and are substantially perpendicular to the surface of the oxide passivating layer 22.

The separation of the grooves 40 must be greater than the diameter of the laser beam. In the present example, the lines 16, 18, and 20 are positioned 7.2 microns center to center. This means that, with a 6–7 micron wide laser beam the grooves 40 can be placed midway between the line 18 and the surrounding lines 16 and 20. Once the grooves 40 are defined they are filled with a non-frangible, high melting point material 41. In the present invention the material selected was tungsten. But other suitable materials which are not easily broken and which have melting points greater than the melting points of the fuse being blown such as molybdenum can be used.

Tungsten was selected, in the present example, because tungsten is widely used for filling the via holes and is used as the interconnecting material between wiring layers in integrated circuits. Although in the present invention no additional layer is shown over the passivation layer 22, additional metallization layers, as will be described in conjunction with FIGS. 9 and 10, could be so provided and the grooves could be made and back filled during the via hole opening and filling steps needed to create the interconnections between levels.

Again it will be assumed that to achieve the desired configuration it is necessary that the central line 18 is to cut. Again a laser beam, indicated in FIG. 7 by circle 50, that is identical, in all respects, to the one described above is directed against the line 18 such that the beam energy is absorbed by the line 18 to vaporize the portion of line 18 where the beam impinges as above described. Again because of the rapidity of the vaporization of that portion of line 18 under the beam a large section of the overlying passivation layer 22 is blown away.

Now however, the barriers 41 disposed in the grooves 40 confine the forces engendered by the line vaporization and prevents the formed crater 34 from expanding sufficiently to reach the adjacent lines 16 and 20. Thus, instead of leaving in the overlying passivation layer a large, substantially circular crater centered abound the point of impact of the beam 30 a more rectangular crater, whose sides are defined by the barriers 41, is created.

It should be noted, the barriers 41 extend at least half way down the thickness of the metal lines 16, 18, and 20. That is, the barriers must extend at least to the midpoint of the thickness of the fuse. By so positioning the barriers 41, not only is the cratering effect contained but substantially all of the beam energy reflected from the positively sloped sides of the line 18 is prevented from reaching the adjacent lines 16 and 20. Any energy that does reach the adjacent lines is insufficient to melt or otherwise physically alter the adjacent lines, Also it should be noted that the barriers are formed of a material that has a melting point substantially higher than the melting point of the lines 16, 18, and 20 thus any reflected energy is insufficient to melt these barriers. Preferably the melting point of the barrier material should be at least 50% higher than the melting point of the fuses. The barriers 41 should also be resistant to cracking in order to prevent any cracks propagated in the passivation layer from reaching the adjacent lines 16 and 20.

Because the cratering of the overlying passivation layer is prevented from extending over the adjacent lines 16 and 20 they do not become exposed and are not subject to corrosion. By preventing the possibility of such corrosion the quality and expected life of the product is enhanced. These barriers also prevent any cracks from extending over to one or more the adjacent lines further enhancing the quality of the product and cutting production losses.

By avoiding these problems encountered by the prior art, optimum circuit layout, denied to the prior art, can be achieved.

The present invention as shown in FIGS. 5 to 8 thus avoids all the problems encountered in the prior art while maintaining the smallest presently achievable inter-line spacing.

Figure 9:
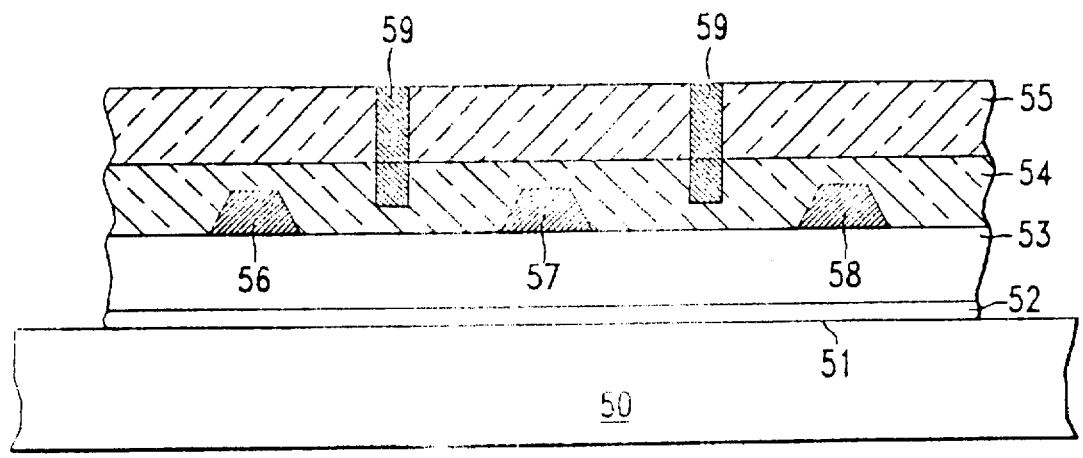
FIG. 9 shows a cross section of an integrated circuit having a fuse array and additional wiring levels.
Figure 10:
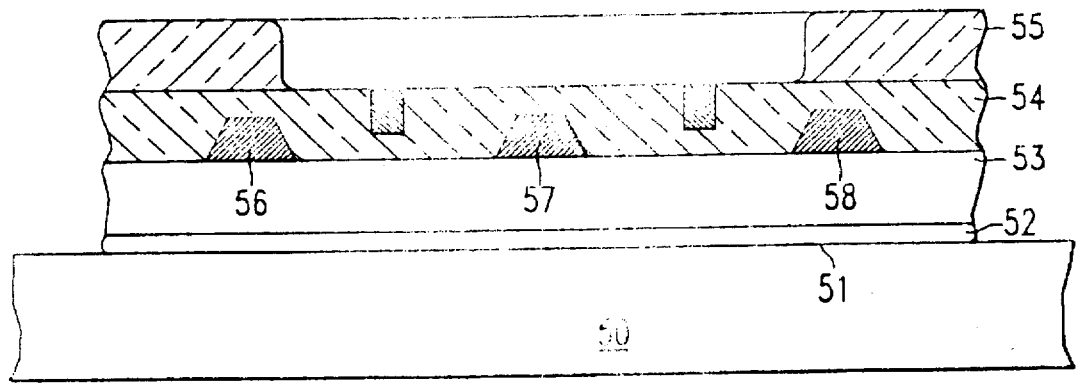
FIG. 10 shows a cross section of a variation of the integrated circuit of FIG. 9.

FIGS. 9 and 10 show a semiconductor substrate provided with a stack of wiring layers. Starting as before with a substrate 50 having active regions (not shown) therein and a dielectric layer 52 disposed on its top surface 51, a first passivated wiring level 53 is provided over the dielectric layer 52. Once this first wiring layer 53 is created, via connections are provided to it and an additional passivated wiring level 54 having a fuse array is similarly created thereon. For clarity of illustration, and because such multi-layered wiring is well known to the prior art, only the fuse array formed of lines 56, 57, and 58 and the associated barriers 59, are shown in these FIGS. 9 and 10. The other wiring in each level and the interconnections therebetween are not shown in these FIGS. 9 and 10. Following the formation of the fuse containing wiring level 54 a capping passivated wiring level 55 is deposed thereon.

It should be noted that the barriers must be in the uppermost layer as shown in FIGS. 5 to 8 or extend to the surface of the capping layer 55, as shown in FIG. 9 or else the capping layer 55 should be removed down to the top of the barriers 59 as shown in FIG. 10.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A semiconductor device comprising:
   a semiconductor substrate having a first insulative layer on a major surface thereof;
   a plurality of metallic circuit elements, including circuit alteration devices having a known melting point, forming an electrical circuit deposed of said layer;
   a passivating layer deposed over said insulating layer and said metallic circuit elements; and bodies of non-frangible barrier material, having a melting point higher than the melting point of said circuit alteration devices, disposed in grooves formed in said passivating layer, and isolated from said circuit elements, said bodies being further positioned adjacent to and on either side of each of said circuit alteration devices and extending between said circuit alteration devices and any adjacent ones of said metallic circuit elements thereto to protect said metallic circuit elements, adjacent to said one of said circuit alteration devices, from any change in resistivity caused by vaporization of said circuit alteration devices by preventing any damage caused by said vaporization of said circuit alteration devices from extending to an adjacent circuit element;

said circuit alteration device being formed of two layers of titanium with a layer of copper aluminum therebetween and having a predetermined melting point and said bodies of barrier material being formed of a material selected from the class consisting of tungsten and molybdenum and having a melting point higher than the melting point of said circuit alteration devices.

2. The device of claim 1 wherein said bodies of barrier material are positioned midway between each one of said circuit alteration devices and any adjacent circuit element.

* * * * *